(12) United States Patent
Kuo

(10) Patent No.: US 9,054,696 B2
(45) Date of Patent: Jun. 9, 2015

(54) GATE DRIVING CIRCUIT, AND ARRAY SUBSTRATE AND DISPLAY PANEL USING THE SAME

(71) Applicant: SHENZHEN CHINA STAR OPTOELECTRONICS TECHNOLOGY CO., LTD., Shenzhen, Guangdong (CN)

(72) Inventor: Ping-Sheng Kuo, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/240,368

(22) PCT Filed: Jan. 23, 2014

(86) PCT No.: PCT/CN2014/071270
§ 371 (c)(1),
(2) Date: Feb. 22, 2014

(65) Prior Publication Data
US 2015/0102735 A1    Apr. 16, 2015

(51) Int. Cl.
| G11C 19/28 | (2006.01) |
| H03K 17/687 | (2006.01) |
| H03K 17/06 | (2006.01) |
| G09G 3/36 | (2006.01) |

(52) U.S. Cl.
CPC ............ *H03K 17/063* (2013.01); *G09G 3/3648* (2013.01); *H03K 17/6871* (2013.01); *G09G 2320/045* (2013.01); *G09G 2320/0204* (2013.01)

(58) Field of Classification Search
CPC .................. G11C 19/28; G09G 2310/0286
USPC .................... 315/161, 169.1–169.3
See application file for complete search history.

(56) References Cited

U.S. PATENT DOCUMENTS

| 6,345,085 | B1* | 2/2002 | Yeo et al. ................. 377/54 |
| 2005/0008114 | A1* | 1/2005 | Moon ..................... 377/64 |
| 2013/0162620 | A1* | 6/2013 | Kim et al. ................. 345/212 |
| 2014/0104153 | A1* | 4/2014 | Ma ......................... 345/100 |
| 2014/0111403 | A1* | 4/2014 | Kim et al. ................. 345/76 |
| 2014/0240209 | A1* | 8/2014 | Zhang .................... 345/92 |

\* cited by examiner

*Primary Examiner* — Douglas W Owens
*Assistant Examiner* — Pedro C Fernandez
(74) *Attorney, Agent, or Firm* — Stein IP, LLC

(57) ABSTRACT

The present invention relates to a gate driving circuit, and a array substrate and a display using the same. The gate driving circuit comprises multiple-stage gate driving units, and each gate driving unit includes: an actuating unit configured to transmit an actuation signal; an energy storage unit configured to execute a charging process under the action of the actuation signal to output a driving voltage; a pull-up unit, a first pull-down unit, a second pull-down unit and a third pull-down unit operating under the action of the driving voltage, wherein a third pull-down unit pulls the driving voltage down to a second reference voltage to apply a reverse bias voltage to the gate-source and/or the gate-drain of transistors in the gate driving circuit, such that the threshold voltage of respective transistors under positive offset can offset reversely, thus effectively eliminating adverse effects of a threshold voltage offset phenomenon of the transistors on the gate driving circuit and improving the operation reliability of the gate driving circuit as well as the array substrate and the display panel thereof.

20 Claims, 6 Drawing Sheets

GATE DRIVING CIRCUIT, AND ARRAY SUBSTRATE AND DISPLAY PANEL USING THE SAME

FIELD OF THE INVENTION

The present disclosure relates to a liquid crystal display driving technology, and particularly, to a gate driving circuit, and an array substrate thereof and a display panel using the same.

BACKGROUND OF THE INVENTION

An existing liquid crystal display panel includes a plurality of pixel units, and a gate driving circuit and a source driving circuit for driving the pixel units to work. In this case, the gate driving circuit includes multi-stage gate driving units, and these gate driving units successively output gate signals through gate lines coupled thereto to control actuation of corresponding switch transistors in a display area, such that data signals output by the source driving circuit are written into the related pixel units to perform image display. Therefore, the operation reliability of the gate driving units has a vital influence on accuracy of imaging.

At present, the gate driving units of the gate driving circuit used by mainstream liquid crystal display panel manufacturers have had a substantially same structure, and may be divided into a plurality of functional modules, such as an actuating unit, an energy storage unit, a pull-up unit, a first pull-down unit and a second pull-down unit, in terms of their functions. These functional modules cooperate with one another under the action of time pulse signals and output gate signals based on input actuation signals and supply it to the related pixel units.

With development of manufacturing process, the existing gate driving circuit may be directly prepared on an array substrate, i.e., it is manufactured to be a circuit with gate driving circuit on array substrate (GOA circuit), and each switch element in the GOA circuit is made of a thin-film transistor. The thin-film transistor is turned on as long as under the condition that, similar to that of a field-effect transistor, the voltage difference of the gate and the source is greater than a threshold voltage. That is, the thin-film transistor could be turned on only when the difference between the gate voltage and the source voltage is greater than the threshold voltage. However, with the increase of the operation time of the thin-film transistor, the threshold voltage of the thin-film transistor is changed, that is, a threshold voltage offset phenomenon may occur.

For example, the threshold voltage of one thin-film transistor is 2V when under a normal condition, but it may offset by +5V with the increase of the operation time. At this time, the thin-film transistor may not be turned on but until the voltage difference of the gate and the source was more than or equal to 7V. Thus, it could be seen that the threshold voltage offset phenomenon of the thin-film transistor may seriously affect the operation performance of the thin-film transistor and thereby affect the operation performance of the gate driving circuit including the thin-film transistor. For example, with the increase of the operation time, if the threshold voltage of the thin-film transistor at the output end of one gate driving unit offsets and the turn-on voltage supplied to the thin-film transistor is still maintained to the turn-on voltage under the normal condition and never changed all the time, then the thin-film transistor would not be normally turned on, such that the gate driving unit can not normally output the gate signal, thus affecting normal display of the liquid crystal display panel.

SUMMARY OF THE INVENTION

Aiming at the above-mentioned problems, the present disclosure provides a gate driving circuit, and an array substrate and a display panel using the same, which may effectively solve the problem in the prior art that the gate driving circuit cannot operate in a normal state because transistors cannot be normally turned on due to threshold voltage offset.

The present disclosure provides a gate driving circuit comprising a plurality of gate driving units, wherein each gate driving unit outputs a gate signal through a gate line coupled thereto, and each gate driving unit includes:

an actuating unit, configured to transmit an actuation signal;

an energy storage unit, coupled to an output end of the actuating unit to receive the actuation signal, and configured to execute a charging process under the action of the actuation signal and output a driving voltage;

a pull-up unit, coupled between the output end of the energy storage unit and the gate line to receive the driving voltage and configured to pull up a gate signal on the gate line under the action of the driving voltage and a time pulse signal;

a first pull-down unit, coupled to the energy storage unit and the gate line and configured to pull the driving voltage and the gate signal down to a first reference voltage under the action of a first control signal;

a second pull-down unit, coupled to the energy storage unit and the gate line and configured to pull the driving voltage and the gate signal down to the first reference voltage under the action of a second control signal; and a third pull-down unit, coupled to the energy storage unit and configured to pull the driving voltage down, under the action of a third control signal, to a second reference voltage lower than the first reference voltage.

Further, in a vertical blanking interval, the above-mentioned third pull-down unit pulls the driving voltage down to the second reference voltage under the action of the third control signal.

Preferably, the above-mentioned second reference voltage is lower than the low level voltage of the time pulse signal.

According to an embodiment of the present disclosure, the above-mentioned third pull-down unit includes:

a transistor, of which a control electrode receives the third control signal, wherein a first electrode and a second electrode of the transistor connects the output end of the energy storage unit with the second reference voltage under the action of the third control signal.

According to an embodiment of the present disclosure, the above-mentioned first pull-down unit includes:

a discharge transistor, of which the gate receives the first control signal, wherein the source and the drain of the discharge transistor connect the output end of the energy storage unit with the first reference voltage under the action of the first control signal;

a pull-down transistor, of which the gate receives the first control signal, wherein the source and the drain of the pull-down transistor connect the gate line with the first reference voltage under the action of the first control signal.

According to an embodiment of the present disclosure, the above-mentioned second pull-down unit includes:

a control module, coupled to the energy storage unit to receive the driving voltage and configured to output the second control signal based on the driving voltage, the first reference voltage and the time pulse signal;

a discharge transistor, of which the gate is coupled to the output end of the control module to receive the second control signal, wherein the source and the drain of the discharge transistor connect the output end of the energy storage unit with the first reference voltage under the action of the second control signal; and a pull-down transistor, of which the gate is coupled to the output end of the control module to receive the second control signal, wherein the source and the drain of the pull-down transistor connect the gate line with the first reference voltage under the action of the second control signal.

According to an embodiment of the present disclosure, the above-mentioned control module includes:

a coupling capacitor, of which a first electrode receives the time pulse signal and a second electrode is used as an output end of the control module and coupled to the discharge transistor and the pull-down transistor; and a transistor, of which the gate is coupled to the output end of the energy storage unit to receive the driving voltage, wherein the source and the drain of the transistor connect the second electrode of the capacitor with the first reference voltage under the action of the driving voltage.

According to an embodiment of the present disclosure, the above-mentioned energy storage unit includes a storage capacitor, wherein a first electrode of the storage capacitor is coupled to the output end of the actuating unit and used as an output end of the energy storage unit, and a second electrode of the storage capacitor is coupled to the circuit connection between the pull-up unit and the gate line.

In addition, the present disclosure also provides an array substrate including the above-mentioned gate driving circuit.

In addition, the present disclosure also provides a display panel including the above-mentioned array substrate.

Compared with the prior art, the present disclosure brings the following beneficial effects.

In present disclosure, the third pull-down unit is added into the gate driving unit of the existing gate driving circuit, and it pulls the driving voltage down to the second reference voltage under the action of the third control signal to apply a reverse bias voltage to the gate-source and/or the gate-drain of transistors in the gate driving circuit, such that the threshold voltage of the respective transistors under positive offset can offset reversely, thus effectively eliminating adverse effects of a threshold voltage offset phenomenon of the transistors on the gate driving circuit and improving the operation reliability of the gate driving circuit as well as the array substrate and the display panel thereof.

In the present disclosure, it is preferable that the third pull-down unit is actuated within the vertical blanking interval of the display panel to apply the reverse bias voltage to respective transistors, which has no interfere to normal operation of the circuit.

Other features and advantages of the present disclosure will be illustrated in the following description, and they will partially become apparent from the description or may be understood through implementing the present disclosure. The objectives and other advantages of the present disclosure may be realized and obtained through the structures specified in the description, claims and accompanying drawings.

BRIEF DESCRIPTION OF THE DRAWINGS

The accompanying drawings are provided for further understanding the present disclosure, and constitute a part of the description for interpreting the present disclosure together with the embodiments of the present disclosure, rather than limit to the present disclosure, wherein.

DETAILED DESCRIPTION OF THE EMBODIMENTS

To illustrate the objectives, technical solutions and technical effects of the present disclosure, with reference to the accompanying drawings, an example is taken by a 7T2C gate driving unit (consisting of seven transistors and two capacitors), and a threshold voltage offset phenomenon of the transistors of the gate driving unit when the gate driving circuit is in operation and improvement made to the problem in the present disclosure are discussed in detail below. It should be particularly noted that although the present disclosure is set forth on the basis of the 7T2C gate driving unit and the thin-film transistors thereof, the present disclosure is not limited thereto. Circuit structures in gate driving units, gate driving circuits and array substrates and display panels thereof designed by various manufacturers are not quite identical, and the transistors in use may not be thin-film transistors. Therefore, any modifications and variations made in either implementation manners or details of the technical solutions by any one skilled in the art without departing from the spirit disclosed in the present disclosure are within the protection scope of the present disclosure.

Figure 1:
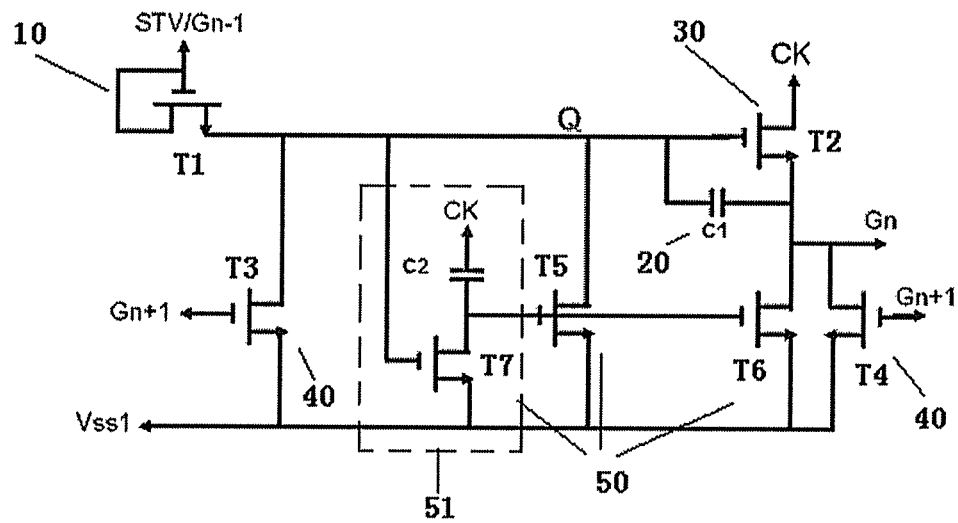
FIG. 1 is a structural schematic diagram of an existing 7T2C gate driving unit circuit.

As shown in FIG. 1, one 7T2C gate driving unit circuit may be divided into a actuating unit 10, an energy storage unit 20, a pull-up unit 30, a first pull-down unit 40 and a second pull-down unit 50 in terms of functions, wherein:

The actuating unit 10 includes a transistor T1, a control electrode of the transistor T1 is in short connection with the first electrode and configured to receive an actuation signal STV, and a second electrode is coupled to the energy storage unit 20. When the actuation signal SW of high-level arrives, the transistor T1 is turned on and transmits the STV signal to the energy storage unit 20.

In this embodiment, said actuation signal SW may be a gate signal Gn−1 from the previous stage of the gate driving unit, and it may not be limited thereto.

The energy storage unit 20 includes a storage capacitor C1, a first electrode of the storage capacitor C1 is coupled to the second electrode of the transistor T1 and configured to receive the actuation signal SW, and a second electrode of the storage capacitor C1 is coupled to a gate line. The storage capacitor C1 executes a charging process based on the actuation signal SW, and the first electrode thereof outputs a high-level driving voltage Q to the pull-up unit 30 after charging is completed.

The pull-up unit 30 includes a transistor T2, a control electrode of the transistor T2 is coupled to the first electrode of the storage capacitor C1 to receive the driving voltage Q, a first electrode of the transistor T2 receives a time pulse signal CK, and a second electrode of the transistor T2 is coupled to the second electrode of the storage capacitor C1 and the gate line. Under the action of the driving voltage Q and the time pulse signal CK, the transistor T2 pulls a gate signal Gn on the gate line up to a high-level voltage.

Figure 2:
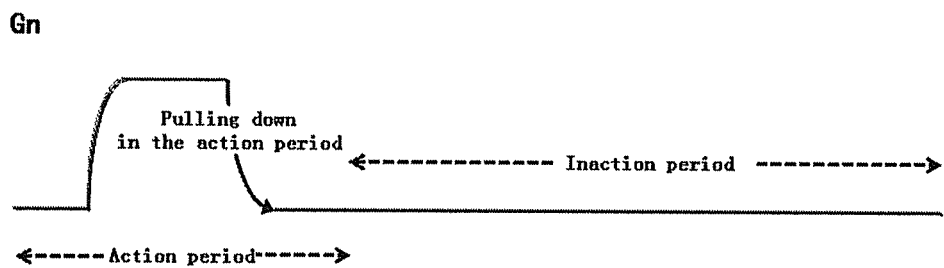
FIG. 2 is a schematic diagram of gate signals output by a gate driving unit in an action period and an inaction period.

As shown in FIG. 2, the operation state of one gate driving unit is generally divided into an action period and an inaction period in term of the high or low level state of the gate signal Gn output by the gate driving unit: in the action period, the gate driving unit outputs the high-level gate signal Gn to turn on the corresponding switch transistors in the display area; and in the inaction period, the gate driving unit outputs the low-level gate signal Gn to turn off the corresponding switching transistors in the display area.

When the gate driving unit works in the action period, the first pull-down unit 40 pulls the driving voltage Q and the gate signal Gn down to a first reference voltage Vss1 based on a first control signal K1, such that the gate driving unit is switched to the inaction period from the action period. Specifically, the first pull-down unit 40 includes:

A discharge transistor T3, of which a control electrode receives the first control signal K1, a first electrode is coupled to the first electrode of the storage capacitor C1, a second electrode receives the first reference voltage Vss1, wherein the first electrode and the second electrode of the discharge transistor T3 are turned on under the action of the first control signal K1 to pull the driving voltage Q down to the first reference voltage Vss1; and A pull-down transistor T4, of which a control electrode receives the first control signal K1, a first electrode is coupled to the gate line and a second electrode receives the first reference voltage Vss1, wherein the first electrode and the second electrode of the pull-down transistor T4 are turned on under the action of the first control signal K1, to pull the gate signal Gn down to the first reference voltage Vss1.

In this embodiment, the first control signal K1 may be a gate signal Gn+1 from the next stage of the gate driving unit, and it may not be limited thereto.

When the gate driving unit operates in the inaction period, each node in the circuit of the gate driving unit continually accumulates charges, and when the charges are accumulated to a sever degree, voltage and current signals, such as the driving voltage Q and the gate signal Gn, may offset, such that the output of the gate driving unit is abnormal. To prevent such phenomenon from affecting the operation reliability of the circuit, a second pull-down unit 50 is used in this embodiment to pull down the driving voltage Q and the gate signal Gn to the first reference voltage Vss1 under the action of a second control signal K2. Specifically, the second pull-down unit 50 includes:

A control module 51, configured to output the second control signal K2 based on the driving voltage Q, the first reference voltage Vss1 and the time pulse signal CK;

A discharge transistor T5, of which a control electrode is coupled to the output end of the control module 51 to receive the second control signal K2, a first electrode is coupled to the first electrode of the storage capacitor C1 and a second electrode receives the first reference voltage Vss1, wherein the first electrode and the second electrode of the discharge transistor T5 are turned on under the action of the second control signal K2 to pull the driving voltage Q down to the first reference voltage Vss1; and A pull-down transistor T6, of which a control electrode is coupled to the output end of the control module 51 to receive the second control signal K2, a first electrode is coupled to the gate line and a second electrode receives the first reference voltage Vss1, wherein the first electrode and the second electrode of the pull-down transistor T6 are turned on under the action of the second control signal K2 to pull the gate signal Gn down to the first reference voltage Vss1.

In this embodiment, the control module 51 may be preferably composed of a coupling capacitor C2 and a transistor T7, wherein:

A first electrode of the coupling capacitor C2 receives the clock pulse signal CK, a second electrode of the coupling capacitor C2 is used as the output end of the control module 51 and coupled to a first electrode of the transistor T7, and a second electrode of the transistor T7 receives the first reference voltage Vss1, and a control electrode of the transistor T7 is coupled to the first electrode of the storage capacitor C1 to receive the driving voltage Q.

When the driving voltage Q is higher than the sum of the threshold voltage of the transistor T7 and the first reference voltage Vss1, the transistor T7 is turned on, such that the second control signal K2 output by the control module 51 is present as the first reference voltage Vss1; and when the driving voltage Q is equal to or lower than the sum of the threshold voltage of the transistor T7 and the first reference voltage Vss1, the transistor 17 is turned off, such that the second control signal K2 output by the control module 51 is present as the clock pulse signal CK passing through the coupling capacitor C2.

The first reference voltage Vss1 required by operation of a gate driving circuit including the above-mentioned gate driving unit is supplied by a power supply chip, and is generally a negative voltage.

The workflow of the gate driving unit is illustrated below with reference to FIGS. 3 to 9 which respectively are an operation time sequence diagram of the 7T2C gate driving unit under the action of the time pulse signal CK and diagrams of the corresponding equivalent circuit thereto.

Figure 4:
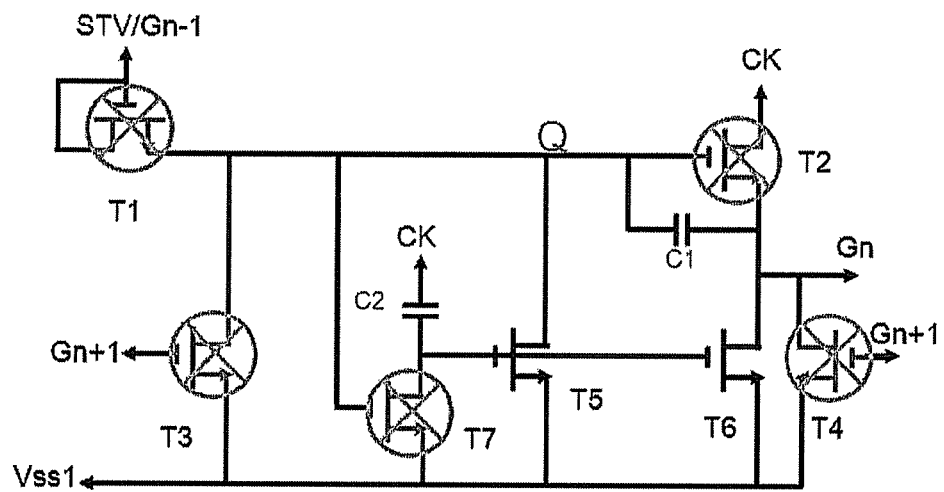
FIG. 4 is a schematic diagram of an equivalent circuit of the gate driving unit of FIG. 1 in a first time period.

As shown in FIG. 4, in the first time period, the actuation signal STV is low, the transistor T1 is turned off, and the driving voltage Q is of low level; under the action of the driving voltage Q, the transistor T2 is turned off, and the gate signal Gn is present as low level; under the action of the driving voltage Q, the transistor T7 is turned off, the second control signal K2 is presented as the clock pulse signal CK, wherein because the clock pulse signal CK at this moment is high, the discharge transistor T5 and the pull-down transistor T6 are thereby turned on to pull the driving voltage Q and the gate voltage Gn down to the first reference voltage Vss1; and the first control signal Gn+1 is low, thereby both the discharge transistor T3 and the pull-down transistor T4 are turned off.

Figure 5:
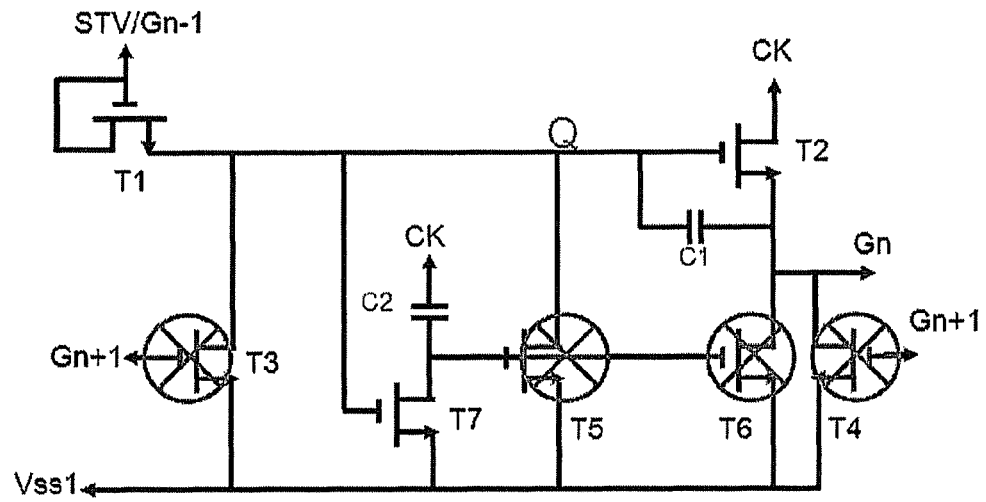
FIG. 5 is a schematic diagram of an equivalent circuit of the gate driving unit of FIG. 1 in a second time period.

As shown in FIG. 5, in the second time period, the actuation signal STV is switched to high level, the transistor T1 is turned on, the storage capacitor C1 thereby executes the charging process and outputs the high-level driving voltage Q at the first electrode thereof; under the action of the driving voltage Q, the transistor T2 is turned on, wherein because the time pulse signal CK at this moment is of low level, the gate signal Gn is thus present as low level; under the action of the driving voltage Q, the transistor T7 is turned on, the second control signal K2 is turned to be the first reference voltage Vss1, wherein because the first reference voltage Vss1 is a negative voltage, the discharge transistor T5 and the pull-down transistor T6 are turned off; and the first control signal Gn+1 is low, thereby the discharge transistor T3 and the pull-down transistor T4 are turned off.

Figure 6:
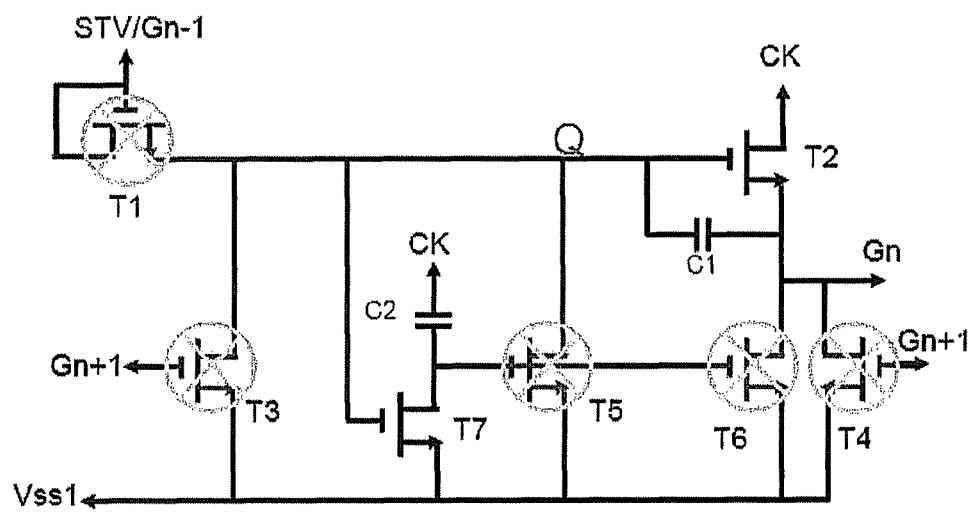
FIG. 6 is a schematic diagram of an equivalent circuit of the gate driving unit of FIG. 1 in a third time period.

As shown in FIG. 6, in the third time period, the actuation signal STV is turned into low level, the transistor T1 is turned off, but the first electrode of the storage capacitor C1 still maintains the high-level driving voltage Q; under the action of the driving voltage Q, the transistor T2 is turned on, wherein because the clock pulse signal CK at this moment is switched to high from low, the gate signal Gn thereby is pulled up to high level $V_{pixel}$, meanwhile, the driving voltage Q is further pulled up to higher level $V_{boost\ high}$ based on rise of the gate signal Gn; under the action of the driving voltage Q, the transistor T7 is turned on, the second control signal K2 is present as the first reference voltage Vss1, wherein because the first reference voltage Vss1 is a negative voltage, the discharge transistor T5 and the pull-down transistor T6 are turned off; and the first control signal Gn+1 is low, thereby the discharge transistor T3 and the pull-down transistor T4 are turned off.

Figure 7:
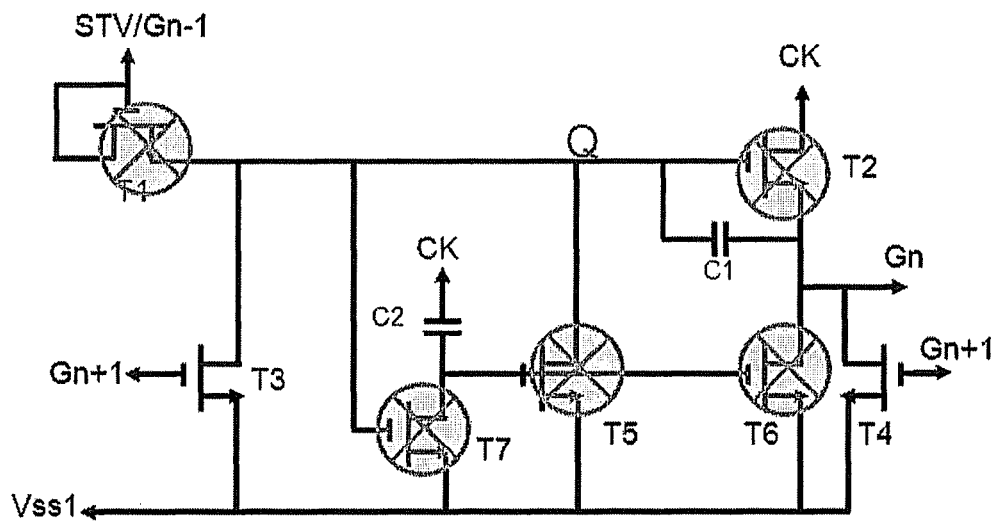
FIG. 7 is a schematic diagram of an equivalent circuit of the gate driving unit o FIG. 1 in a fourth time period.

As shown in FIG. 7, in the fourth time period, the actuation signal STV is low, and thus the transistor T1 is turned off; the first control signal Gn+1 is present as high level, the discharge transistor T3 and the pull-down transistor T4 thereby are turned on to pull the driving voltage Q and the gate voltage Gn down to the first reference voltage Vss1; under the action of the driving voltage Q, the transistor T2 and the transistor T7 are turned off, the second control signal K2 is turned to be the clock pulse signal CK, wherein because the clock pulse signal CK at this moment is low, the discharge transistor T5 and the pull-down transistor T6 are turned off.

Figure 8:
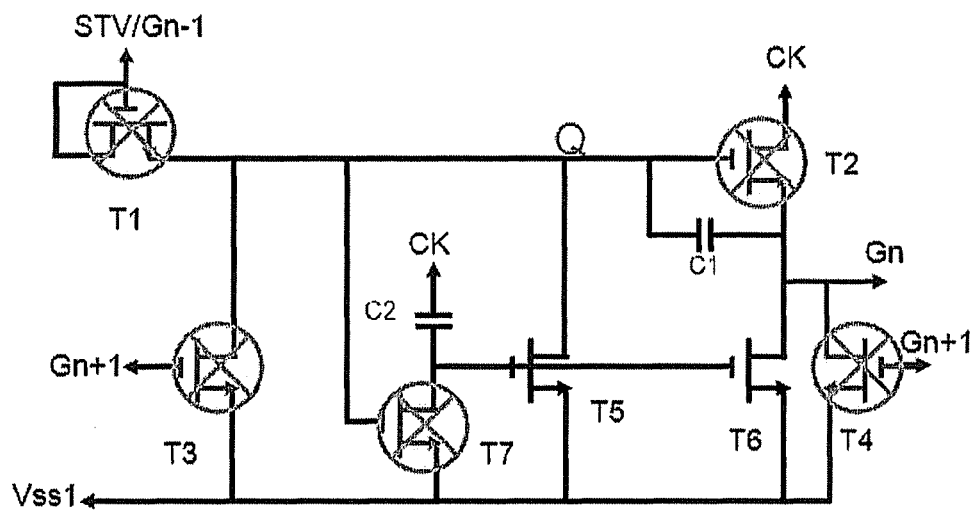
FIG. 8 is a schematic diagram of an equivalent circuit of the gate driving unit of FIG. 1 in a fifth time period.

As shown in FIG. 8, in the fifth time period, the actuation signal SW is low, and thus the transistor T1 is turned off; since the driving voltage Q and the gate voltage Gn have been pulled down to the first reference voltage Vss1, under the action of the driving voltage Q, the transistor T2 and the transistor T7 are turned off, and the second control signal K2 is present as the clock pulse signal CK, wherein because the clock pulse signal CK at this moment is of high level, both the discharge transistor T5 and the pull-down transistor T6 are turned on to pull the driving voltage Q and the gate voltage Gn down to the first reference voltage Vss1 respectively; and the first control signal Gn+1 has been switched to low from high, and thereby the discharge transistor T3 and the pull-down transistor T4 are turned off. Therefore, it can be seen that the operation status of the gate driving unit in the fifth time period is the same with that of the first time period.

Figure 9:
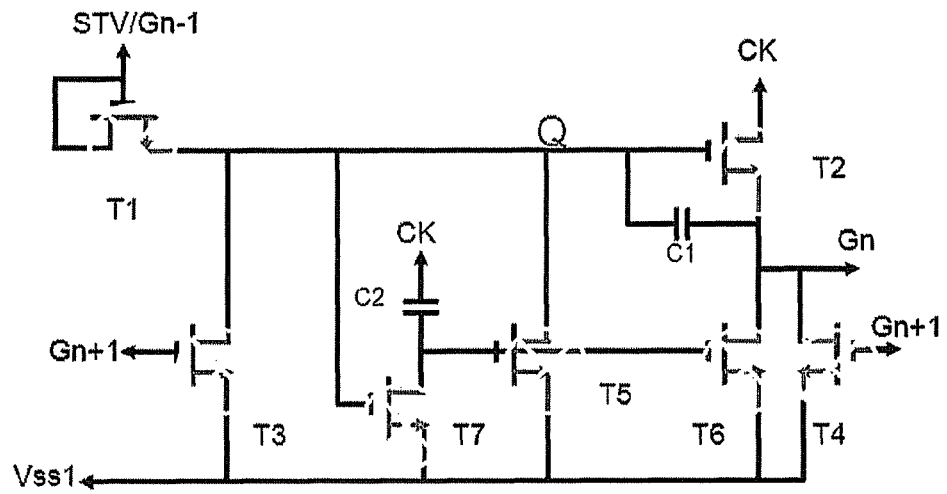
FIG. 9 is a schematic diagram of an equivalent circuit of the gate driving unit of FIG. 1 in a sixth time period.

As shown in FIG. 9, in the sixth time period, the actuation signal SW is low, and thus the transistor T1 is turned off; since the driving voltage Q and the gate voltage Gn have been pulled down to the first reference voltage Vss1, under the action of the driving voltage Q, the transistor T2 and the transistor T7 are turned off, and the second control signal K2 is present as the clock pulse signal CK, wherein because the clock pulse signal CK at this moment is of low level, the discharge transistor T5 and the pull-down transistor T6 thereby are turned off; and the first control signal Gn+1 is of low level, and thereby the discharge transistor T3 and the pull-down transistor T4 are turned off. Therefore, as long as no new actuation signal SW is input thereafter, the gate driving unit would repeat actions in the fifth time period and the sixth time period, such that the driving voltage and the gate voltage Gn are maintained in a low level state.

As introduced in the background of the invention, each above-mentioned transistor may be preferably made of a thin-film transistor, in which a control electrode may be the gate, and a first electrode and a second electrode may be the drain or the source respectively, this may be specifically configured in terms of the flowing direction of electric current, not limited herein. Nevertheless, to further illustrate the voltage relationship among the gate, the drain and the source, an example is taken by using the first electrodes of the transistors T2 and T7 as the drains and the second electrodes thereof as the sources, such that the voltage relationship of respective nodes of the above-mentioned 7T2C circuit in the third time period is illustrated below in conjunction with FIGS. 3 and 10.

Figure 3:
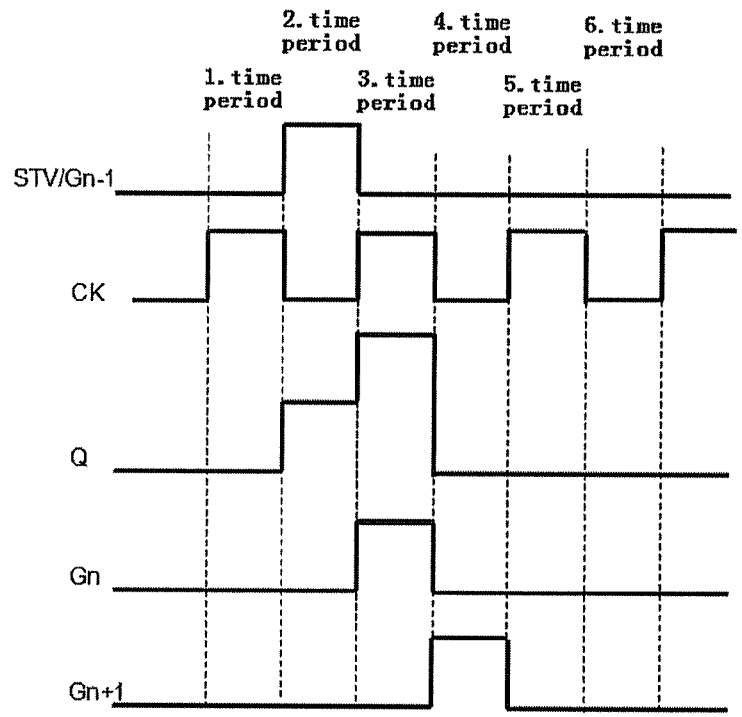
FIG. 3 is an operation time sequence diagram of the gate driving unit circuit of FIG. 1.
Figure 10:
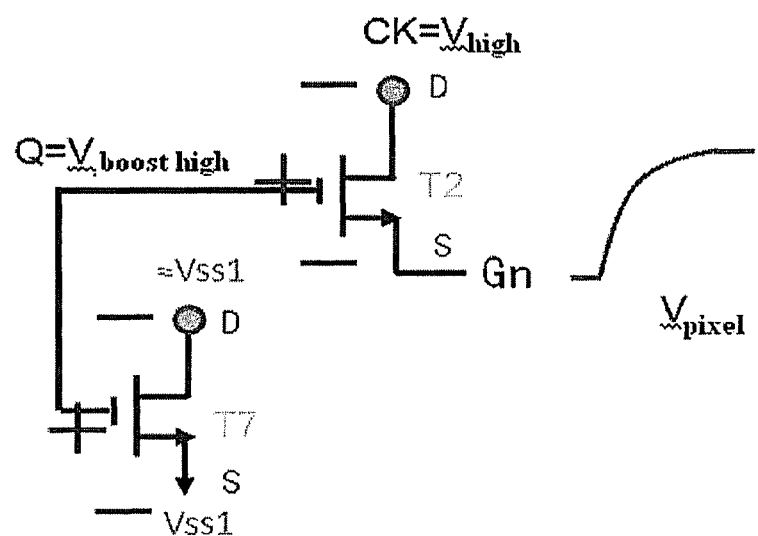
FIG. 10 is a schematic diagram of anode voltage of the gate driving unit circuit of FIG. 1 in the third time period.
Figure 11:
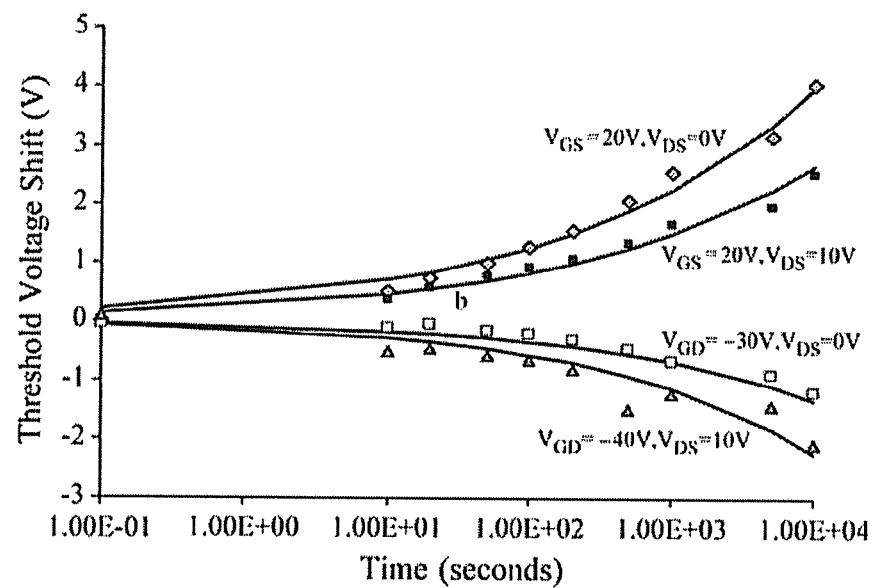
FIG. 11 is a schematic diagram of threshold voltage offset of thin-film transistors.

As shown in FIGS. 3 and 10, the driving voltage Q in the third time period is present as high level $V_{boost\ high}$, the gate signal Gn is of high level $V_{pixel}$, and $V_{boost\ high}$ is greater than $V_{pixel}$; the voltage difference between the gate and the source of the transistor T2 is $V_{GS}=V_{boost\ high}-V_{pixel}$, and the voltage difference between the gate and the drain of the transistor T2 is $V_{GD}=V_{boost\ high}-V_{ck}$, wherein $V_{ck}$ is the high level $V_{high}$ of the time pulse signal CK; and the voltage difference between the gate and the source of the transistor T7 is $V_{GS}=V_{boost\ high}+|Vss1|$, and the voltage difference between the gate and the drain of the transistor T7 is $V_{GD}=V_{boost\ high}+|Vss1|$. It could be seen that the voltages between the gates and the sources and between the gates and the drains of both the two transistors T2 and T7 are in positive bias. It could be seen from the description of the background that when the voltage either between the gate and the source or between the gate and the drain of one transistor is in positive bias, or else when both the voltages between the gate and the source and between the gate and the drain are in positive bias simultaneously, the threshold voltage of the transistor may offset positively, and the offset is continually increased with the increase of the operation time (as shown in FIG. 11). After the threshold voltage of one transistor offsets positively, if the value of actuation voltage supplied to the transistor was maintained the one under the normal condition, the transistor can not be turned on, such that the circuit including the transistor cannot work in a normal manner.

Through long-term research and test, researchers of the present disclosure find that after experiments regarding high-temperature and high-voltage reliability test performed on the gate driving circuit on basis of above-mentioned 7T2C circuit structure, very serious threshold voltage offset phenomenon is happened to the transistors T2 and T7, such that the gate driving unit circuit thereof may fail and cannot normally output the gate signal.

Figure 12:
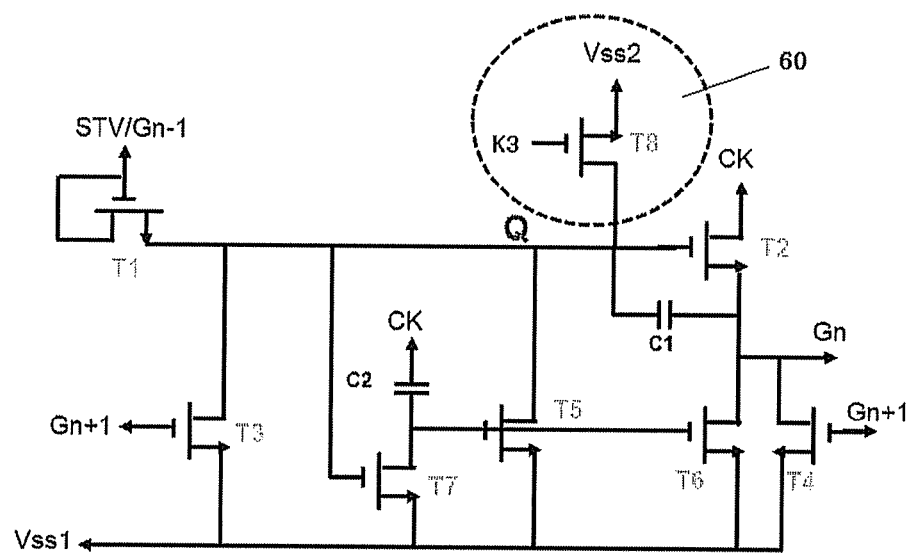
FIG. 12 is a structural schematic diagram of a gate driving unit circuit of an embodiment of the present disclosure.

As shown in FIG. 12, to solve the above-mentioned problem, the existing gate driving unit circuit is improved by the present disclosure. That is, a third pull-down unit 60 is added into the existing gate driving unit circuit and configured to further pull down the driving voltage Q, under the action of a third control signal K3, to a second reference voltage Vss2 lower than the first reference voltage Vss1. Specifically, the third pull-down unit 60 includes:

A transistor T8, of which a control electrode receives the third control signal K3, a first electrode is coupled to the first electrode of the storage capacitor C1 and a second electrode receives the second reference voltage Vss2, and it is configured to pull the driving voltage Q down to the second reference voltage Vss2 under the action of the third control signal K3.

The above-mentioned third control signal K3 may be triggered at a vertical blanking interval, such that the third pull-down unit is started to operate at the vertical blanking interval, thus pulling the driving voltage Q down to the second reference voltage Vss2.

Wherein, the level of the above-mentioned second reference voltage Vss2 may be configured based on the specific circuit requirement and is supplied by a power supply chip, which is generally a negative voltage. The trigger time of the third control signal K3 may also be configured based on the specific circuit requirement.

The node voltage of the improved 7T2C circuit is reanalyzed below. In the vertical blanking interval, the source voltages of the transistors T2 and T7 are present as the first reference voltage Vss1, but after the third pull-down unit pulls the driving voltage Q down to the second reference voltage Vss2, the gate voltages of the transistors T2 and 17 are present as the second reference voltage Vss2. As the second reference voltage Vss2 is lower than the first reference voltage Vss1, the voltage difference between the gates and the sources of the transistors T2 and T7 is negative. That is, a reverse bias voltage is applied between the gate and the source respectively of the transistors T2 and T7. It could be known from the operation characteristics of the thin-film transistors that when the reverse bias voltage is applied between the gate and the source or between the gate and the drain of one thin-film transistor, alternatively, simultaneously applied between the gate and the source and between the gate and the drain of one thin-film transistor, the threshold voltage of the thin-film transistor may occur reverse offset.

In conclusion, by using a second unit to apply the reverse bias voltage, in the vertical blanking interval, between the gate and the source and/or between the gate and the drain of one thin-film transistor which has positive offset in the threshold voltage, the positive offset of the threshold voltage of the thin-film transistor in the previous phase (for example, in the third time period) may be reduced or counteracted, such that adverse effects of the threshold voltage offset phenomenon of the thin-film transistor on the gate driving circuit are effectively eliminated, and thereby improving the operation reliability of the gate driving circuit.

It should be noted that the low level $V_{low}$ of the time pulse signal CK is generally set as the first reference voltage Vss1, thus the operation condition that the above-mentioned second reference voltage Vss2 is lower than the first reference voltage Vss1 enables the gate voltage of the transistor T2 to be lower than the drain voltage. However, in case that the low level $V_{low}$ of the time pulse signal CK is not set as conventionally, in order to enable the gate voltage of the transistor T2 to be lower than the drain voltage, the above-mentioned second reference voltage Vss2 should simultaneously be lower than the low level $V_{low}$ of the time pulse signal CK.

In addition, the present disclosure also provides an embodiment of an array substrate including the above-mentioned gate driving circuit.

In another aspect, the present disclosure also provides an embodiment of a display panel including the above-mentioned array substrate.

Although the embodiments disclosed in the present disclosure are described as above, the foregoing contents are merely the embodiments employed for facilitating understanding of the present disclosure, rather than limit to the present disclosure. Any modifications and variations may be made in implementation manners and details to respective units, such as the actuating unit, the energy storage unit, the pull-up unit, the first pull-down unit and the second pull-down unit, in the above-mentioned gate driving unit and respective circuit module thereof. All the modifications and variations made in implementation manners and details by any one skilled in the art without departing from the spirit disclosed in the present disclosure should be within the patent protection scope of the present disclosure. Accordingly, the patent protection scope of the present disclosure should be subjected to the scope defined by the appended claims.

What is claimed is:

1. A gate driving circuit, comprising a plurality of gate driving units, wherein each gate driving unit outputs a gate signal through a gate line coupled thereto, and each gate driving unit includes:
    an actuating unit configured to transmit an actuation signal;
    an energy storage unit coupled to an output end of the actuating unit to receive the actuation signal, and configured to execute a charging process under the action of the actuation signal and output a driving voltage;
    a pull-up unit coupled between the output end of the energy storage unit and the gate line to receive the driving voltage, and configured to pull up a gate signal on the gate line under the action of the driving voltage and a time pulse signal;
    a first pull-down unit coupled to the energy storage unit and the gate line, and configured to pull the driving voltage and the gate signal down to a first reference voltage under the action of a first control signal;
    a second pull-down unit coupled to the energy storage unit and the gate line, and configured to pull the driving voltage and the gate signal down to the first reference voltage under the action of a second control signal; and
    a third pull-down unit coupled to the energy storage unit, and configured to pull the driving voltage down, under the action of a third control signal, to a second reference voltage lower than the first reference voltage.

2. The gate driving circuit of claim 1, wherein,
    in a vertical blanking interval, the third pull-down unit pulls the driving voltage down to the second reference voltage under the action of the third control signal.

3. The gate driving circuit of claim 1, wherein,
    the second reference voltage is lower than the low level voltage of the time pulse signal.

4. The gate driving circuit of claim 2, wherein,
    the second reference voltage is lower than the low level voltage of the time pulse signal.

5. The gate driving circuit of claim 1, wherein, the third pull-down unit includes:
    a transistor, of which a control electrode receives the third control signal, wherein a first electrode and a second electrode of the transistor connects the output end of the energy storage unit with the second reference voltage under the action of the third control signal.

6. The gate driving circuit of claim 2, wherein, the third pull-down unit includes:
    a transistor, of which a control electrode receives the third control signal, wherein a first electrode and a second electrode of the transistor connects the output end of the energy storage unit with the second reference voltage under the action of the third control signal.

7. The gate driving circuit of claim 3, wherein, the third pull-down unit includes:
    a transistor, of which a control electrode receives the third control signal, wherein a first electrode and a second electrode of the transistor connects the output end of the energy storage unit with the second reference voltage under the action of the third control signal.

8. The gate driving circuit of claim 1, wherein, the first pull-down unit includes:
    a discharge transistor, of which the gate receives the first control signal, wherein the source and the drain of the discharge transistor connect the output end of the energy storage unit with the first reference voltage under the action of the first control signal; and a pull-down transistor, of which the gate receives the first control signal, wherein the source and the drain of the pull-down transistor connect the gate line with the first reference voltage under the action of the first control signal.

9. The gate driving circuit of claim 2, wherein, the first pull-down unit includes:
  a discharge transistor, of which the gate receives the first control signal, wherein the source and the drain of the discharge transistor connect the output end of the energy storage unit with the first reference voltage under the action of the first control signal; and
  a pull-down transistor, of which the gate receives the first control signal, wherein the source and the drain of the pull-down transistor connect the gate line with the first reference voltage under the action of the first control signal.

10. The gate driving circuit of claim 3, wherein, the first pull-down unit includes:
  a discharge transistor, of which the gate receives the first control signal, wherein the source and the drain of the discharge transistor connect the output end of the energy storage unit with the first reference voltage under the action of the first control signal; and
  a pull-down transistor, of which the gate receives the first control signal, wherein the source and the drain of the pull-down transistor connect the gate line with the first reference voltage under the action of the first control signal.

11. The gate driving circuit of claim 1, wherein, the second pull-down unit includes:
  a control module coupled to the energy storage unit to receive the driving voltage, and configured to output the second control signal based on the driving voltage, the first reference voltage and the time pulse signal;
  a discharge transistor, of which the gate is coupled to the output end of the control module to receive the second control signal, wherein the source and the drain of the discharge transistor connect the output end of the energy storage unit with the first reference voltage under the action of the second control signal; and
  a pull-down transistor, of which the gate is coupled to the output end of the control module to receive the second control signal, wherein the source and the drain of the pull-down transistor connect the gate line with the first reference voltage under the action of the second control signal.

12. The gate driving circuit of claim 2, wherein, the second pull-down unit includes:
  a control module coupled to the energy storage unit to receive the driving voltage, and configured to output the second control signal based on the driving voltage, the first reference voltage and the time pulse signal;
  a discharge transistor, of which the gate is coupled to the output end of the control module to receive the second control signal, wherein the source and the drain of the discharge transistor connect the output end of the energy storage unit with the first reference voltage under the action of the second control signal; and
  a pull-down transistor, of which the gate is coupled to the output end of the control module to receive the second control signal, wherein the source and the drain of the pull-down transistor connect the gate line with the first reference voltage under the action of the second control signal.

13. The gate driving circuit of claim 3, wherein, the second pull-down unit includes:
  a control module coupled to the energy storage unit to receive the driving voltage, and configured to output the second control signal based on the driving voltage, the first reference voltage and the time pulse signal;
  a discharge transistor, of which the gate is coupled to the output end of the control module to receive the second control signal, wherein the source and the drain of the discharge transistor connect the output end of the energy storage unit with the first reference voltage under the action of the second control signal; and
  a pull-down transistor, of which the gate is coupled to the output end of the control module to receive the second control signal, wherein the source and the drain of the pull-down transistor connect the gate line with the first reference voltage under the action of the second control signal.

14. The gate driving circuit of claim 11, wherein, the control module includes:
  a coupling capacitor, of which a first electrode receives the time pulse signal and a second electrode is used as an output end of the control module, and coupled to the discharge transistor with the pull-down transistor; and
  a transistor, of which the gate is coupled to the output end of the energy storage unit to receive the driving voltage, wherein the source and the drain of the transistor connect the second electrode of the capacitor with the first reference voltage under the action of the driving voltage.

15. The gate driving circuit of claim 1, wherein, the energy storage unit includes a storage capacitor, a first electrode of the storage capacitor is coupled to the output end of the actuating unit and used as an output end of the energy storage unit, and a second electrode of the storage capacitor is coupled to the circuit connection between the pull-up unit and the gate line.

16. An array substrate including a gate driving circuit, the gate driving circuit comprising a plurality of gate driving units, wherein each gate driving unit outputs a gate signal through a gate line coupled thereto, and each gate driving unit includes:
  an actuating unit configured to transmit an actuation signal;
  an energy storage unit coupled to an output end of the actuating unit to receive the actuation signal, and configured to execute a charging process under the action of the actuation signal and output a driving voltage;
  a pull-up unit coupled between the output end of the energy storage unit and the gate line to receive the driving voltage, and configured to pull up a gate signal on the gate line under the action of the driving voltage and a time pulse signal;
  a first pull-down unit coupled to the energy storage unit and the gate line, and configured to pull the driving voltage and the gate signal down to a first reference voltage under the action of a first control signal;
  a second pull-down unit coupled to the energy storage unit and the gate line, and configured to pull the driving voltage and the gate signal down to the first reference voltage under the action of a second control signal; and
  a third pull-down unit coupled to the energy storage unit, and configured to pull the driving voltage down, under the action of a third control signal, to a second reference voltage lower than the first reference voltage.

17. The array substrate of claim 16, wherein,
in a vertical blanking interval, the third pull-down unit pulls the driving voltage down to the second reference voltage under the action of the third control signal.

18. The array substrate of claim 16, wherein,
the second reference voltage is lower than the low level voltage of the time pulse signal.

19. A display panel including an array substrate, the array substrate having a gate driving circuit comprising a plurality of gate driving units, wherein each gate driving unit outputs a gate signal through a gate line coupled thereto, and each gate driving unit includes:
- an actuating unit configured to transmit an actuation signal;
- an energy storage unit coupled to an output end of the actuating unit to receive the actuation signal, and configured to execute a charging process under the action of the actuation signal and output a driving voltage;
- a pull-up unit coupled between the output end of the energy storage unit and the gate line to receive the driving voltage, and configured to pull up a gate signal on the gate line under the action of the driving voltage and a time pulse signal;
- a first pull-down unit coupled to the energy storage unit and the gate line, and configured to pull the driving voltage and the gate signal down to a first reference voltage under the action of a first control signal;
- a second pull-down unit coupled to the energy storage unit and the gate line, and configured to pull the driving voltage and the gate signal down to the first reference voltage under the action of a second control signal; and
- a third pull-down unit coupled to the energy storage unit, and configured to pull the driving voltage down, under the action of a third control signal, to a second reference voltage lower than the first reference voltage.

20. The display panel of claim 19, wherein,
in a vertical blanking interval, the third pull-down unit in each gate driving unit pulls the driving voltage down to the second reference voltage under the action of the third control signal.

* * * * *

UNITED STATES PATENT AND TRADEMARK OFFICE
CERTIFICATE OF CORRECTION

PATENT NO.         : 9,054,696 B2
APPLICATION NO.    : 14/240368
DATED              : June 9, 2015
INVENTOR(S)        : Kuo Page 1 of 1

It is certified that error appears in the above-identified patent and that said Letters Patent is hereby corrected as shown below:

On the title page

Item [86] should read
PCT Pub. No.:  WO/2015/051609
PCT Pub. Date: April 16, 2015

Item [30] should read
October 12, 2013    CN    201310477378.6

Signed and Sealed this
Seventeenth Day of May, 2016

Michelle K. Lee
*Director of the United States Patent and Trademark Office*